United States Patent
Tseng et al.

(10) Patent No.: US 11,742,262 B2
(45) Date of Patent: Aug. 29, 2023

(54) INTEGRATED CIRCUIT HAVING A RESISTOR LAYER PARTIALLY OVERLAPPING ENDCAPS

(71) Applicant: Taiwan Semiconductor Manufacturing Co., Ltd., Hsinchu (TW)

(72) Inventors: Yuan-Tai Tseng, Zhubei (TW); Chia-Shiung Tsai, Hsinchu (TW); Chung-Yen Chou, Hsinchu (TW); Ming-Chyi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 115 days.

(21) Appl. No.: 17/233,676

(22) Filed: Apr. 19, 2021

(65) Prior Publication Data

US 2021/0242109 A1    Aug. 5, 2021

Related U.S. Application Data

(60) Continuation of application No. 16/221,767, filed on Dec. 17, 2018, now Pat. No. 10,985,090, which is a
(Continued)

(51) Int. Cl.
*H01L 23/485* (2006.01)
*H01C 17/075* (2006.01)
(Continued)

(52) U.S. Cl.
CPC ........... *H01L 23/485* (2013.01); *H01C 7/006* (2013.01); *H01C 17/075* (2013.01);
(Continued)

(58) Field of Classification Search
CPC ... H01C 17/06–20; H01C 7/006; H01L 28/24; H01L 23/5228; H01L 28/20; H01L 21/707; H01L 27/016
See application file for complete search history.

(56) References Cited

U.S. PATENT DOCUMENTS 6,034,411 A    3/2000    Wade et al.
6,165,862 A   12/2000    Ishikawa et al.
(Continued)

FOREIGN PATENT DOCUMENTS

JP        11224801        8/1999

OTHER PUBLICATIONS

Menon, S.S. et al., "Comparison of the Ti/TiN/AlCu/TiN Stack With TiN/AlCu/Ti/TiN Stack for Application in ULSI Metallizaton," Sep. 13, 1996, pp. 1-12, SPIE vol. 2875.

*Primary Examiner* — Younes Boulghassoul
(74) *Attorney, Agent, or Firm* — Slater Matsil, LLP (57) ABSTRACT

A novel integrated circuit and method thereof are provided. The integrated circuit includes a plurality of first interconnect pads, a plurality of second interconnect pads, a first inter-level dielectric layer, a thin film resistor, and at least two end-caps. The end-caps, which are connectors for the thin film resistor, are positioned at the same level with the plurality of second interconnect pads. Therefore, an electrical connection between the end-caps and the plurality of second interconnect pads can be formed by directly connection of them. An integrated circuit with a thin film resistor can be made in a cost benefit way accordingly, so as to overcome disadvantages mentioned above.

20 Claims, 6 Drawing Sheets

Related U.S. Application Data division of application No. 15/489,494, filed on Apr. 17, 2017, now Pat. No. 10,157,820, which is a division of application No. 14/019,986, filed on Sep. 6, 2013, now Pat. No. 9,627,467.

(51) Int. Cl.

| | | |
|---|---|---|
| *H01C 7/00* | (2006.01) | |
| *H01L 23/522* | (2006.01) | |
| *H01L 23/532* | (2006.01) | |
| *H01L 21/70* | (2006.01) | |
| *H01L 21/768* | (2006.01) | |
| *H01L 49/02* | (2006.01) | |

(52) U.S. Cl.
CPC ........ *H01L 21/707* (2013.01); *H01L 21/7685* (2013.01); *H01L 21/76846* (2013.01); *H01L 21/76849* (2013.01); *H01L 21/76895* (2013.01); *H01L 23/5228* (2013.01); *H01L 28/24* (2013.01); *H01L 23/5329* (2013.01); *H01L 23/53238* (2013.01); *H01L 2924/0002* (2013.01)

(56) References Cited

U.S. PATENT DOCUMENTS

| | | | |
|---|---|---|---|
| 6,207,560 | B1 | 3/2001 | Lee |
| 6,497,824 | B1 | 12/2002 | Chen et al. |
| 6,703,666 | B1 | 3/2004 | Huttemann et al. |
| 7,332,403 | B1 | 2/2008 | Hill et al. |
| 7,410,879 | B1 | 8/2008 | Hill et al. |
| 7,633,373 | B1 | 12/2009 | Johnson et al. |
| 7,669,313 | B2 | 3/2010 | Fivas et al. |
| 8,334,187 | B2 | 12/2012 | Chang et al. |
| 2002/0020879 | A1 | 2/2002 | Shiiki et al. |
| 2002/0037643 | A1 | 3/2002 | Ishimaru |
| 2005/0029566 | A1 | 2/2005 | Chen et al. |
| 2005/0218478 | A1* | 10/2005 | Watanabe ........... H01L 27/0802 257/E27.047 |
| 2005/0258513 | A1 | 11/2005 | Eshun |
| 2007/0069334 | A1 | 3/2007 | Beach et al. |
| 2008/0237800 | A1 | 10/2008 | Chinthakindi et al. |
| 2009/0023263 | A1 | 1/2009 | Phan et al. |
| 2010/0073122 | A1 | 3/2010 | Le Neel et al. |
| 2010/0136764 | A1* | 6/2010 | Dirnecker ......... H01L 21/76838 257/E21.004 |
| 2011/0128692 | A1 | 6/2011 | Gaul et al. |
| 2011/0318898 | A1 | 12/2011 | Chang et al. |
| 2012/0049323 | A1 | 3/2012 | Ng et al. |
| 2013/0093056 | A1 | 4/2013 | Kim |
| 2013/0234333 | A1 | 9/2013 | Cheng |
| 2014/0184381 | A1* | 7/2014 | Hao ....................... H01L 28/24 29/25.42 |
| 2014/0239449 | A1* | 8/2014 | Dirnecker ........... H01L 27/0802 257/536 |

\* cited by examiner

Fig. 11 ion Ser. No. 16/221,767, filed on Dec. 17, 2018, entitled
INTEGRATED CIRCUIT HAVING A RESISTOR LAYER PARTIALLY OVERLAPPING ENDCAPS

PRIORITY CLAIM AND CROSS-REFERENCE

This application is a continuation of U.S. patent application Ser. No. 16/221,767, filed on Dec. 17, 2018, entitled "Integrated Circuit and Manufacturing and Method Thereof," now U.S. Pat. No. 10,985,090, which is a divisional of U.S. patent application Ser. No. 15/489,494, filed on Apr. 17, 2017, entitled "Methods for Manufacturing a Thin Film Resistor over Interconnect Pads," now U.S. Pat. No. 10,157,820, which is a divisional of U.S. patent application Ser. No. 14/019,986, filed on Sep. 6, 2013, entitled "Integrated Circuit and Manufacturing and Method Thereof," now U.S. Pat. No. 9,627,467, each application is hereby incorporated herein by reference in its entirety.

BACKGROUND

Thin film resistors (TFRs) are very attractive components for high precision analog and mixed signal applications, and have been utilized in electronic circuits of many important technological applications. The TFRs may be part of an individual device, or may be part of a complex hybrid circuit or integrated circuit. Special cares are required as integrating TFRs into existing process flows of an integrated circuit.

Generally, in fabricating a TFR in an integrated circuit, materials of the TFR are evaporated or sputtered onto a substrate wafer at a metal interconnect level and subsequently patterned and etched. As such, the TFR is embedded between the inter-metal dielectric (IMD) layers. The TFR needs an electrical connection. Therefore, two extra mask layers are required to form the TFRs itself and to form the contact points of the TFR. Conventionally, the connection of TFRs and other devices within an integrated circuit is made from an overlying metal interconnect layer to the contact points of the TFRs. The contact points of the TFRs are required to protect the resistor during via etch, which is the process to contact the overlying metal interconnect layer and the resistor.

Therefore, the cost of fabrication of an integrated circuit with TFRs is increased by additional masks for TFRs. Besides, process margin and the reliability of the integrated circuit produced are also limited by multiple deposition and dry/wet etch steps which are required to incorporate TFRs into the integrated circuit. Accordingly, improvements in structures and methods of forming the integrated circuit with TFRs continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, an interlayer dielectric (ILD) layer includes embodiments having two or more such ILD layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Conventionally approach by embedding TFR into intermetal dielectric (IMO) layer is generally used. It needs two extra masks and corresponding Litho/Etch processes for fabrication. Therefore, the cost of fabrication of an integrated circuit with TFRs is increased, and process margin and the reliability of the integrated circuit produced are also limited. In this regard, an integrated circuit and a method of manufacturing the integrated circuit are provided according to various embodiments of the present disclosure.

Figure 1:
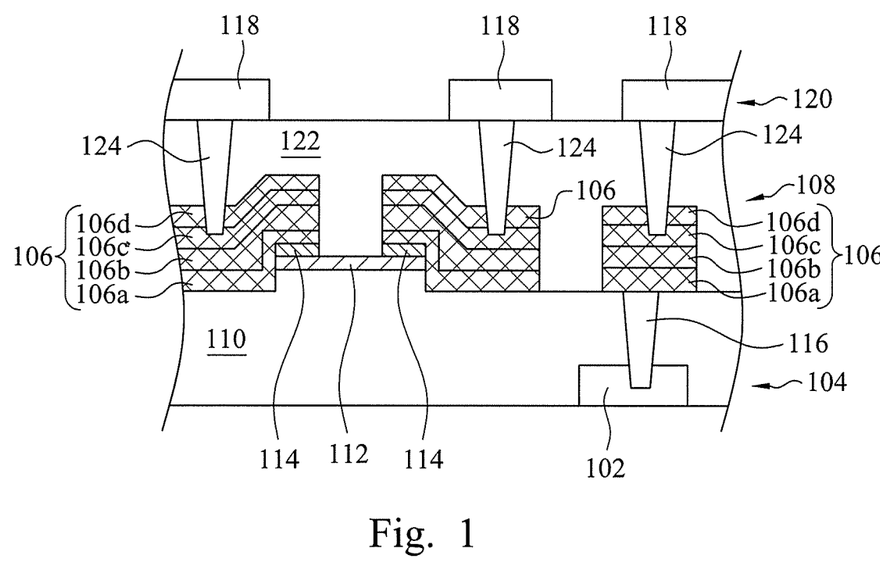
FIG. 1 is a schematic view of at least a portion of an integrated circuit according to various embodiments of the present disclosure.

FIG. 1 is a schematic view of at least a portion of an integrated circuit according to various embodiments of the present disclosure. The integrated circuit includes a plurality of first interconnect pads 102, a plurality of second interconnect pads 106, a first inter-level dielectric layer 110, a thin film resistor 112, and at least two end-caps 114. The plurality of first interconnect pads 102 is disposed at a first interconnect level 104. The plurality of second interconnect pads 106 is disposed at a second interconnect level 108, wherein the second interconnect level 108 is above the first interconnect level 104. The first inter-level dielectric layer 110 disposed between the first interconnect level 104 and the second interconnect level 108. The plurality of first interconnect pads 102 and the plurality of second interconnect pads 106 are made of conductive materials such as metals, and are respectively arranged in various layout corresponding to various electrical conducting paths. The plurality of first interconnect pads 102 and the plurality of second interconnect pads 106 may be made of a bulk of conductive material or a lamination of conductive material layers. In various embodiments of the present disclosure, the second interconnect pads 106 includes a first titanium nitride (TiN) layer 106a, an aluminum copper (AlCu) layer 106b, a second titanium nitride (TiN) layer 106c, and a silicon oxynitride (SiON) layer 106d. The aluminum copper (AlCu) layer 106b is disposed on the first titanium nitride (TiN) layer 106a, the second titanium nitride (TiN) layer 106c is disposed on the aluminum copper (AlCu) layer 106b, silicon oxynitride (SiON) layer 106d is disposed on the second titanium nitride (TiN) layer 106c.

The first inter-level dielectric layer 110 may be formed of an oxide layer, such as $SiO_2$. In advanced technologies having smaller critical dimensions, a variety of inter-level dielectric materials may be used, such as medium k dielectric materials, low-k dielectric materials having k less than 3.5, or ELK dielectric materials having a dielectric constant k less than 3.0. For example, inter-level dielectric materials such as undoped silica glass (USG), phosphor doped silicate glass (PSG), fluorine doped silicate glass (FSG), a boron doped silicate glass (BSG) layer, or a boron phosphorous-doped silicate glass (BPSG) layer may be used.

The thin film resistor 112 is electrically connecting two of the plurality of second interconnect pads disposed at the second interconnect level. As illustrated in FIG. 1, the thin film resistor 112 and the plurality of second interconnect pads 106 are disposed at the same level. The thin film resistor 112 includes a thin film resistor material, such as silicon chromium (SiCr). Alternatively, the thin film resistor 112 includes other suitable resistive materials, such as nickel chromium (NiCr) or tantalum nitride (TaN). The material of the thin film resistor 112 can be selected based on the resistor properties desired. The thin film resistor 112 has a thickness of about 10 A to about 1,000 A. The thin film resistor 112 is formed by a suitable process, such as CVO, PVO, ALD, HDPCVD, MOCVD, RPCVD, PECVD, PLD, other suitable techniques, or combinations thereof.

As shown in FIG. 1, two end-caps 114 are disposed between the thin film resistor 112 and two of the plurality of second interconnect pads 106, respectively. It should be noticed that each end-cap 114 contacts both of the thin film resistor 112 and one of the plurality of second interconnect pads 106 directly. The end-caps 114 are electrically coupled only through the thin film resistor 112. In other words, the end-caps 114 are directly contacted to the corresponding second interconnect pad 106. The two end-caps 114 are respectively an input and an output of the thin film resistor 112. The conductive paths between the thin film resistor 112 and the second interconnect pads 106 are formed by direct connections instead of connecting through vias. As aforementioned, since the thin film resistor 112 and the plurality of second interconnect pads 106 are disposed at the same level (the second interconnect level 108), the end-caps 114 can be directly connected to both of the thin film resistor 112 and one of the plurality of second interconnect pads 106 respectively. In various embodiments of the present disclosure, the end-caps 114 may be titanium nitride (TiN), tantalum nitride (TaN), titanium tungsten (TiW), or tantalum tungsten (TaW). The end-caps 114 may have a thickness, for example, from about 100 angstroms to about 1000 angstroms. The end-caps 114 may also prevent the thin film resistor 112 from oxidation and provide a glue layer for the subsequently deposited contact metal.

As illustrated in FIG. 1, in various embodiments of the present disclosure, the end-caps 114 are disposed above the thin film resistor 112, and each end-cap 114 is covered by one of the plurality of second interconnect pads 106 respectively. Accordingly, the second interconnect pad 106 which covers the end-cap 114 can be the conductive pad for current input or output of the thin film resistor 112. In various embodiments of the present disclosure, the integrated circuit further includes a plurality of third interconnect pads 118, a second inter-level dielectric layer 122, and a plurality of second vias 124. The plurality of third interconnect pads 118 is disposed on a third interconnect level 120, wherein the third interconnect level 120 is above the second interconnect level 108. The plurality of third interconnect pads 118 is made of conductive materials such as metals, and are arranged in various layout to form various electrical conducting paths. The plurality of third interconnect pads 118 may be made of a bulk of conductive material or a lamination of conductive material layers. The second inter-level dielectric layer 122 is disposed between the second interconnect level 108 and the third interconnect level 104. The second inter-level dielectric layer 122 may be formed of an oxide layer, such as $SiO_2$. In advanced technologies having smaller critical dimensions, a variety of inter-level dielectric materials may be used, such as medium k dielectric materials, low-k dielectric materials having k less than 3.5, or ELK dielectric materials having a dielectric constant k less than 3.0. For example, inter-level dielectric materials such as undoped silica glass (USG), phosphor doped silicate glass (PSG), fluorine doped silicate glass (FSG), a boron doped silicate glass (BSG) layer, or a boron phosphorous-doped silicate glass (BPSG) layer may be used.

The plurality of second vias 124 disposed in the second inter-level dielectric layer 122 and connecting the plurality of second interconnect pads 106 and the plurality of third interconnect pads 118 respectively. Each end-cap 114 is electrically connected to one of the plurality of third interconnect pads 118 through one of the plurality of second vias 124 respectively. Therefore, the conductive path of the current input/output of the thin film resistor 112 is established. As illustrated in FIG. 1, for example, a current signal can be inputted by the third interconnect pad 118 on left side of the thin film resistor 112, then the current signal flows in the second via 124, the second interconnect pad 106 and the end-cap 114 which are on left side of the thin film resistor 112, the thin film resistor 112, the end-cap 114 and the second interconnect pad 106 which are on right side of the thin film resistor 112, the second via 124, and the current signal is finally outputted by the third interconnect pad 118 on the right side of the thin film resistor 112. For another example, a current signal can also be inputted by the third interconnect pad 118 on right side of the thin film resistor 112, then the current signal flows in the second via 124, the second interconnect pad 106 and the end-cap 114 which are on right side of the thin film resistor 112, the thin film resistor 112, the end-cap 114 and the second interconnect pad 106 which are on the left side of the thin film resistor 112, the second via 124, and the current signal is finally outputted by the third interconnect pad 118 on left side of the thin film resistor 112. Besides, in various embodiments of the present disclosure, the integrated circuit further includes a plurality of first vias 116 disposed in the first inter-level dielectric layer 110 and connecting the plurality of first interconnect pads 116 and the plurality of second interconnect pads 108 respectively. Therefore, as also illustrated in FIG. 1, another conductive path without passing the thin film resistor 112 can be also established between the first interconnect pad 102, the second interconnect pad 106, and the third interconnect pad 118 by the first via 116 and the second via 124.

Figure 2:
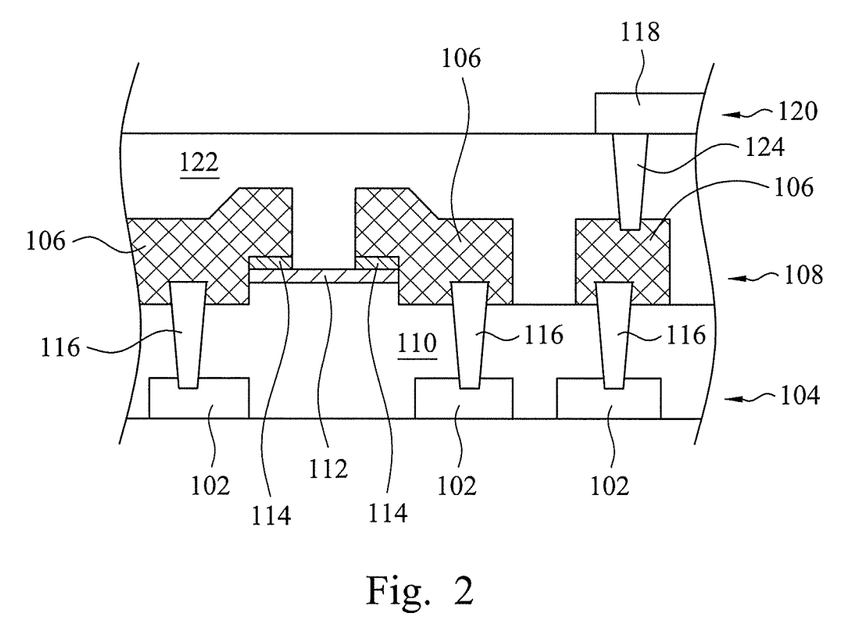
FIG. 2 is a schematic view of at least a portion of an integrated circuit according to various embodiments of the present disclosure.

FIG. 2 is a schematic view of at least a portion of an integrated circuit according to various embodiments of the present disclosure. The integrated circuit includes a plurality of first interconnect pads 102, a plurality of second interconnect pads 106, a first inter-level dielectric layer 110, a thin film resistor 112, and at least two end-caps 114. The positions of above elements and the connections between them are similar to those described above, and therefore the details are omitted here. The differences between the integrated circuit illustrated in FIG. 2 and that in FIG. 1 is that each end-cap 114 is electrically connected to one of the plurality of first interconnect pads 102 through one of the plurality of first vias 116 respectively. Accordingly, another conductive path of the current input/output of the thin film resistor 112 is established. As illustrated in FIG. 2, for example, a current signal can be inputted by the first interconnect pad 102 on left side of the thin film resistor 112, then the current signal flows in the first via 116, the second interconnect pad 106 and the end-cap 114 which are on left side of the thin film resistor 112, the thin film resistor 112, the end-cap 114 and the second interconnect pad 106 which are on right side of the thin film resistor 112, the first via 116, and the current signal is finally outputted by the first interconnect pad 102 on the right side of the thin film resistor 112. For another example, a current signal can also be inputted by the first interconnect pad 102 on right side of the thin film resistor 112, then the current signal flows in the first via 116, the second interconnect pad 106 and the end-cap 114 which are on right side of the thin film resistor 112, the thin film resistor 112, the end-cap 114 and the second interconnect pad 106 which are on left side of the thin film resistor 112, the first via, and the current signal is finally outputted by the first interconnect pad 102 on left side of the thin film resistor 112.

Figure 3:
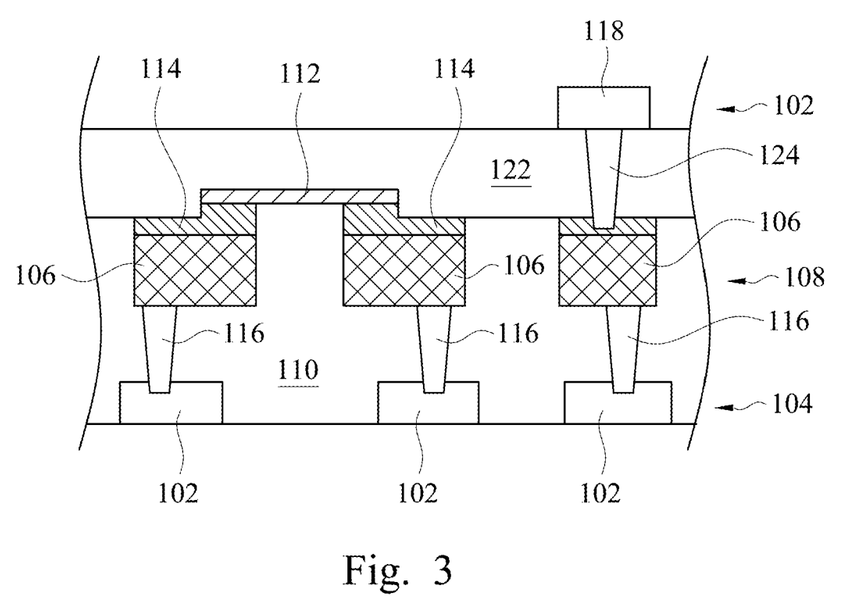
FIG. 3 is a schematic view of at least a portion of an integrated circuit according to various embodiments of the present disclosure.

FIG. 3 is a schematic view of at least a portion of an integrated circuit according to various embodiments of the present disclosure. The integrated circuit includes a plurality of first interconnect pads 102, a plurality of second interconnect pads 106, a first inter-level dielectric layer 110, a thin film resistor 112, and at least two end-caps 114. The positions of above elements and the connections between them are similar to those described above, and therefore the details are omitted here. The differences between the integrated circuit illustrated in FIG. 3 and that in FIG. 1 is that the end-caps 114 are disposed below the thin film resistor 112, and each end-cap 114 is disposed above one of the plurality of second interconnect pads 106 respectively. As illustrated in FIG. 3, in various embodiments of the present disclosure, the plurality of first vias 116 disposed in the first inter-level dielectric layer 110 and connecting the plurality of first interconnect pads 102 and the plurality of second interconnect pads 106 respectively, wherein each end-cap 114 is electrically connected to one of the plurality of first interconnect pads 102 through one of the plurality of first vias 116 respectively. The end-caps 114 are disposed on two of the plurality of second interconnect pads 106 instead of being covered by the second interconnect pads 106 (as shown in FIG. 1 and FIG. 2). In various embodiments of the present disclosure, the second interconnect pad 106 includes an aluminum copper (AlCu) layer, and a titanium nitride (TiN) layer disposed on the aluminum copper (AlCu) layer. Accordingly, another conductive path of the current input/output of the thin film resistor 112 is established. As illustrated in FIG. 3, for example, a current signal can be inputted by the first interconnect pad 102 on left side of the thin film resistor 112, then the current signal flows in the first via 116, the second interconnect pad 106 and the end-cap 114 which are on left side of the thin film resistor 112, the thin film resistor 112, the end-cap 114, the second interconnect pad 106 and the first via 116 which are on right side of the thin film resistor 112, and the current signal is finally outputted by the first interconnect pad 102 on the right side of the thin film resistor 112. For another example, a current signal can also be inputted by the first interconnect pad 102 on right side of the thin film resistor 112, then the current signal flows in the first via 116, the second interconnect pad 106 and the end-cap 114 which are on right side of the thin film resistor 112, the thin film resistor 112, the end-cap 114, the second interconnect pad 106 and the first via 116 which are on the left side of the thin film resistor 112, and the current signal is finally outputted by the first interconnect pad 102 on left side of the thin film resistor 112.

Figure 4:
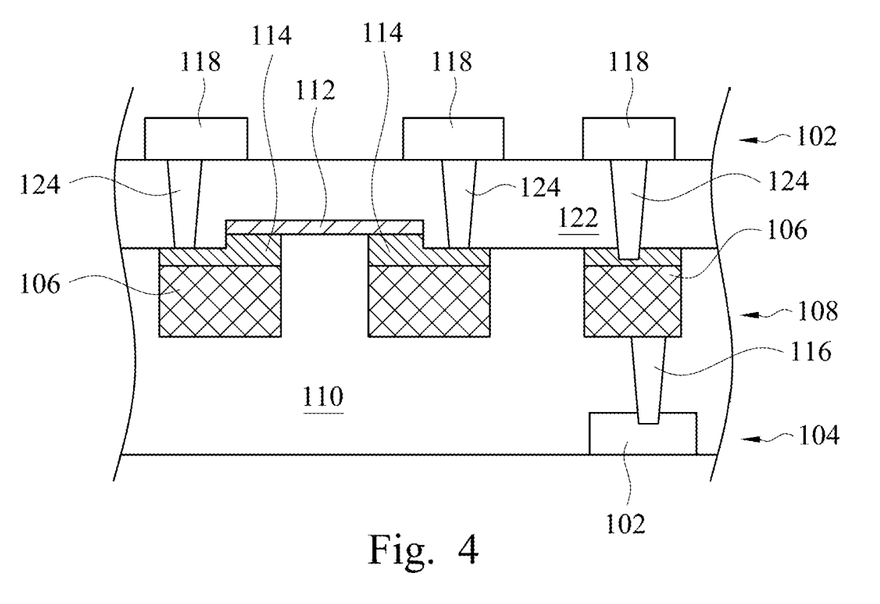
FIG. 4 is a schematic view of at least a portion of an integrated circuit according to various embodiments of the present disclosure.

FIG. 4 is a schematic view of at least a portion of an integrated circuit according to various embodiments of the present disclosure. The integrated circuit includes a plurality of first interconnect pads 102, a plurality of second interconnect pads 106, a first inter-level dielectric layer 110, a thin film resistor 112, and at least two end-caps 114. The positions of above elements and the connections between them are similar to those described above, and therefore the details are omitted here. In various embodiments of the present disclosure, the plurality of third interconnect pads 118 are disposed on the third interconnect level 102, wherein the third interconnect level 102 is above the second interconnect level 108. The second inter-level dielectric layer 122 is disposed between the second interconnect level 108 and the third interconnect level 102. The plurality of second vias 124 are disposed in the second inter-level dielectric layer 122 and electrically connecting the plurality of second interconnect pads 106 and the plurality of third interconnect pads 118 respectively. The differences between the integrated circuit illustrated in FIG. 4 and that in FIG. 3 is that each end-cap 114 is electrically connected to one of the plurality of third interconnect pads 118 through one of the plurality of second vias 124 respectively. Accordingly, another conductive path of the current input/output of the thin film resistor 112 is established. As illustrated in FIG. 4, for example, a current signal can be inputted by the third interconnect pad 118 on left side of the thin film resistor 112, then the current signal flows in the second via 124 and the end-cap 114 which are on left side of the thin film resistor 112, the thin film resistor 112, the end-cap 114 and the second via 124 which are on right side of the thin film resistor 112, and the current signal is finally outputted by the third interconnect pad 118 on the right side of the thin film resistor 112. For another example, a current signal can also be inputted by the third interconnect pad 118 on right side of the thin film resistor 112, then the current signal flows in the second via 124 and the end-cap 114 which are on right side of the thin film resistor 112, the thin film resistor 112, the end-cap 114 and the second via 124 which are on the left side of the thin film resistor 112, and the current signal is finally outputted by the third interconnect pad 118 on left side of the thin film resistor 112.

Figure 5:
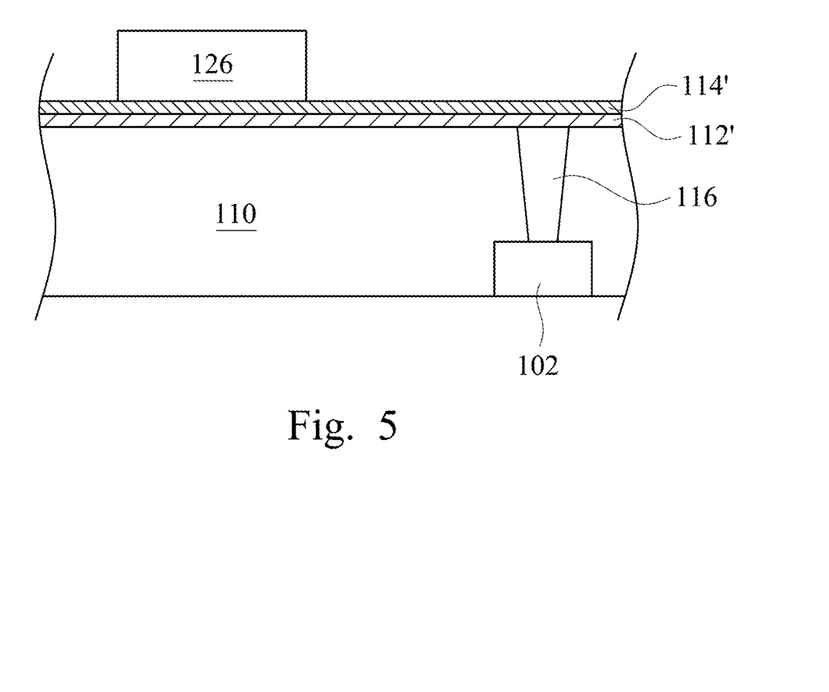
FIG. 5 is a schematic view of at least a portion of an integrated circuit in an intermediate stage of manufacture according to various embodiments of the present disclosure.

A method for fabricating an integrated circuit according to various embodiments of the present disclosure will now be described in conjunction with FIG. 5-8. FIG. 5 is a schematic view of at least a portion of an integrated circuit in an intermediate stage of manufacture according to various embodiments of the present disclosure. A semiconductor substrate having a plurality of first interconnect pads 102 and a first inter-level dielectric layer 110 is provided. The plurality of first interconnect pads 102 may be formed, for example, a blanket coating of Al may be sputter deposited. A photo resist mask may then be formed thereover to delineate where metal interconnects are desired. The blanket Al is then etched with a suitable etchant. The photo resist mask is then stripped, and the plurality of first interconnect pads 102 are formed. The first inter-level dielectric layer 110 covers the plurality of first interconnect pads 102. The first inter-level dielectric layer 110 may be formed by a suitable process, such as CVD, PVD, ALD, HOPCVD, MOCVD, RPCVD, PECVD, PLD, other suitable techniques, or combinations thereof. The first inter-level dielectric layer 110 may be, for example, formed of an oxide layer, such as SiO$_2$. In advanced technologies having smaller critical dimensions, a variety of inter-level dielectric materials may be used, such as medium k dielectric materials, low-k dielectric materials having k less than 3.5, or ELK dielectric materials having a dielectric constant k less than 3.0. For example, ILO materials such as un-doped silica glass (USG), phosphor doped silicate glass (PSG), fluorine doped silicate glass (FSG), a boron doped silicate glass (BSG) layer, or a boron phosphorous-doped silicate glass (BPSG) layer may be used. In various embodiments of the present disclosure, a plurality of first vias 116 may be formed in the first inter-level dielectric layer 110 to connect the plurality of first interconnect pads 102.

As illustrated in FIG. 5, a lamination of a metal resistor layer 112' and a metal capping layer 114' is formed on the first inter-level dielectric layer 110, wherein the metal resistor layer 112' is sandwiched by the metal capping layer 114' and the first inter-level dielectric layer 110. The metal resistor layer 112' includes a variety of materials including tantalum nitride (TaN), silicon chromium (SiCr), and nickel chromium (NiCr), and is formed by a suitable process, such as CVD, PVD, ALD, HDPCVD, MOCVD, RPCVD, PECVD, PLD, other suitable techniques, or combinations thereof. The metal capping layer 114' is formed over the resistive film layer 140. The metal capping layer 114' may be, for example, titanium nitride (TiN), tantalum nitride (TaN), titanium tungsten (TiW), or tantalum tungsten (TaW). In some embodiments, the metal capping layer 114' has a thickness from about 100 angstroms to about 1000 angstroms. The metal capping layer 114' prevents the metal resistor layer 112' from oxidation and provides a glue layer for the subsequently deposited contact metal. To prevent oxidation, the metal capping layer 114' may be deposited in situ, without removing from the fabrication tool. In some embodiments, the metal resistor layer 112' and metal capping layer 114' may be formed in the same chamber of the tool. In other embodiments, the metal resistor layer 112' and metal capping layer 114' may be formed in respective chambers of a sealed cluster tool, with a robotic device transferring the substrate between chambers under vacuum or in an inert or reducing gas environment, to avoid contamination.

Figure 6:
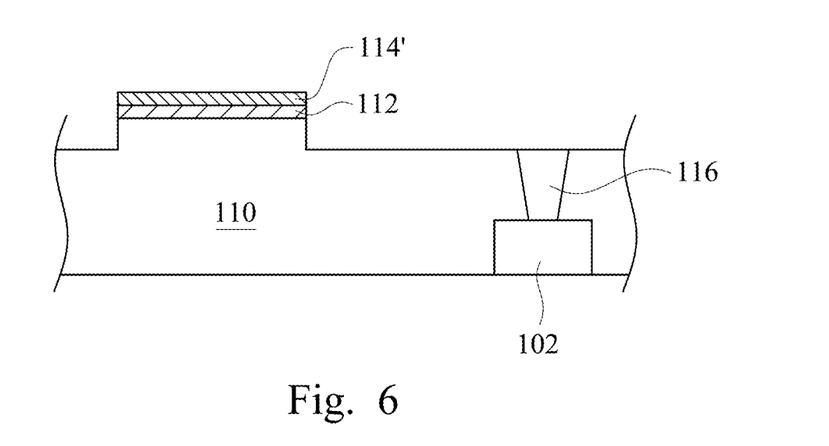
FIG. 6 is a schematic view of the integrated circuit shown in FIG. 5 in a subsequent stage of manufacture according to various embodiments of the present disclosure.

FIG. 6 is a schematic view of the integrated circuit shown in FIG. 5 in a subsequent stage of manufacture according to various embodiments of the present disclosure. The lamination of the metal resistor layer 112' and the metal capping layer 114' is then patterned to define an active area of a thin film resistor 112. For example, the lamination of the metal resistor layer 112' and the metal capping layer 114' is delineated with a photoresist 126 as shown in FIG. 5. The photoresist 126 masks the portions of the lamination where the metal resistor layer 112' are desired. The exposed portions of the lamination will not constitute the thin film resistor 112, and are removed with a suitable etchant. The photoresist 126 is then stripped after the etching process, and the structure illustrated in FIG. 6 is formed.

Figure 7:
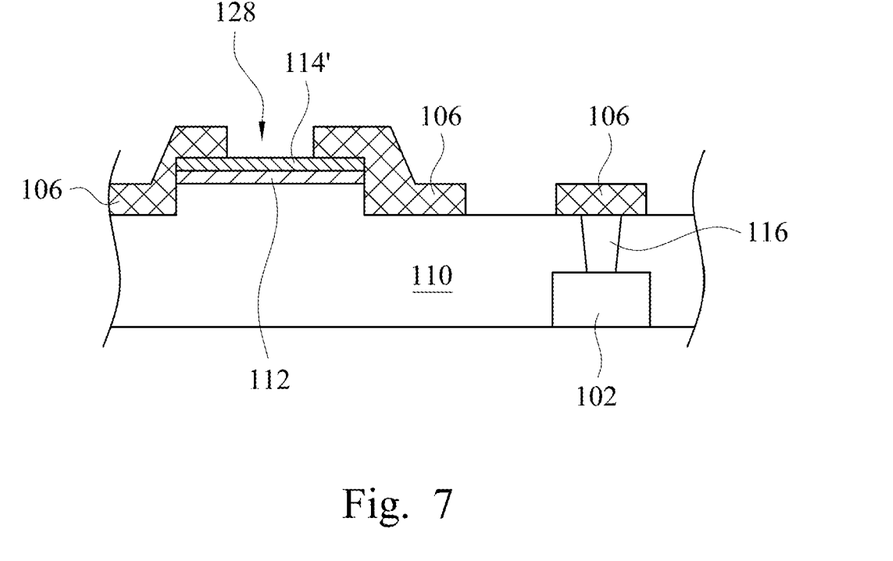
FIG. 7 is a schematic view of the integrated circuit shown in FIG. 6 in a subsequent stage of manufacture according to various embodiments of the present disclosure.

FIG. 7 is a schematic view of the integrated circuit shown in FIG. 6 in a subsequent stage of manufacture according to various embodiments of the present disclosure. A plurality of second interconnect pads 106 is formed on the first inter-level dielectric layer 110 and the lamination of the thin film resistor 112 and the metal capping layer 114'. It should be noticed that two of the plurality of second interconnect pads 106 cover different parts of the metal capping layer 114' respectively and another part 128 of the metal capping layer 114' is exposed. The plurality of second interconnect pads 106 may be formed, for example, a conductive material may be sputter deposited. Photo resist mask may then be formed thereover to delineate where metal interconnects are desired. The conductive material is then etched with a suitable etchant. The photo resist mask is then stripped, and the plurality of second interconnect pads 106 are formed. In various embodiments of the present disclosure, the conductive material includes the lamination of TiN, AlCu, TiN, and SiON layers (from bottom to top). It should noticed that the second interconnect pads 106, which respectively cover different parts of the metal capping layer 114', protect two ends of the metal capping layer 114' on the thin film resistor 112. The protected two ends of the metal capping layer 114' are predetermined to form the two end-caps on the thin film resistor 112 in the following process. As also shown in FIG. 7, in various embodiments of the present disclosure, some of the plurality of second interconnect pads 106 are connected to the first vias 116 disposed in the first inter-level dielectric layer 110, and are electrically connected to the plurality of first interconnect pads 102.

Figure 8:
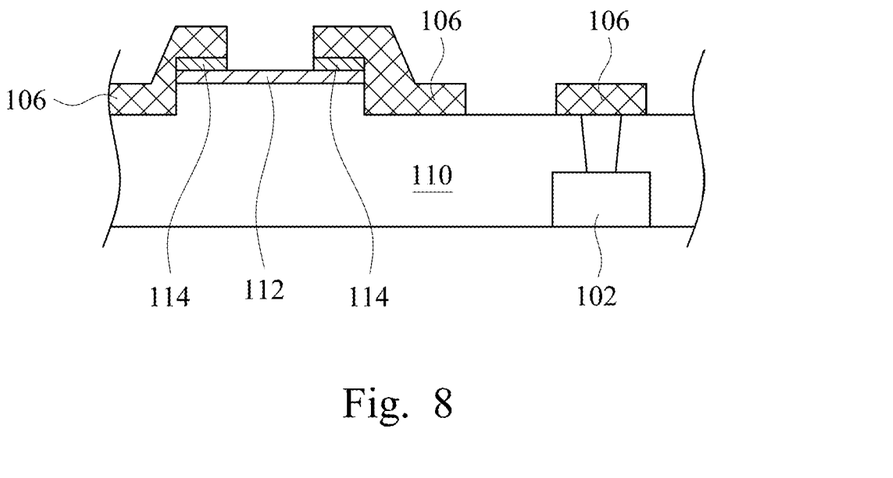
FIG. 8 is a schematic view of the integrated circuit shown in FIG. 7 in a subsequent stage of manufacture according to various embodiments of the present disclosure.

FIG. 8 is a schematic view of the integrated circuit shown in FIG. 7 in a subsequent stage of manufacture according to various embodiments of the present disclosure. The exposed part 128 of the metal capping layer 114' is removed such that two electrically insulated end-caps 114 are formed. The end-caps 114 are electrically coupled only through the thin film resistor 112. In various embodiments of the present disclosure, the exposed part 128 of the metal capping layer 114' is removed by wet etch instead of dry etch, so as to avoid the thin film resistor 112 damaged by plasma. It should be noticed that the second interconnect pads 106, which respectively cover different parts of the metal capping layer 114', can be regarded as the mask of the metal capping layer 114'. Therefore, an extra mask for forming the two end-caps 114 on the thin film resistor 112 is eliminated. Besides, the electrical connection between the two end-caps 114 and the second interconnect pads 106 can be easily established since the two end-caps 114 on the thin film resistor 112 is directly connected to the second interconnect pads 106 respectively. Accordingly, the cost for manufacturing of an integrated circuit is reduced because the extra mask for forming the two end-caps 114 on the thin film resistor 112 is eliminated. The process margin for manufacturing of an integrated circuit can be increased and the reliability of the integrated circuit produced can be improved due to the simplified process operations aforementioned. Referring to FIG. 8 and FIG. 1, in some embodiments of the present disclosure, after the operation of removing the exposed part 128 of the metal capping layer 114', the second inter-level dielectric layer 122 is deposited to cover the plurality of second interconnect pads 106, the metal resistor layer 112, and the first inter-level dielectric layer 110. The material and method of depositing the second inter-level dielectric layer 122 is similar to those of the first inter-level dielectric layer 110 aforementioned, therefore the details are omitted here. The plurality of second vias 124 is formed through the second inter-level dielectric layer 122 to connect the plurality of second interconnect pads 106 respectively. The plurality of third interconnect pads 118 is formed on the second inter-level dielectric layer 122. The plurality of third interconnect pads 118 is electrically connected to the plurality of second interconnect pads 106 respectively. Therefore, the conductive path as aforementioned in FIG. 1 is established. In other embodiments of the present disclosure as illustrated in FIG. 2, each end-cap 114 is electrically connected to one of the plurality of first interconnect pads 102 through one of the plurality of first vias 116 respectively, and therefore the conductive path as aforementioned in FIG. 2 is established.

Figure 9:
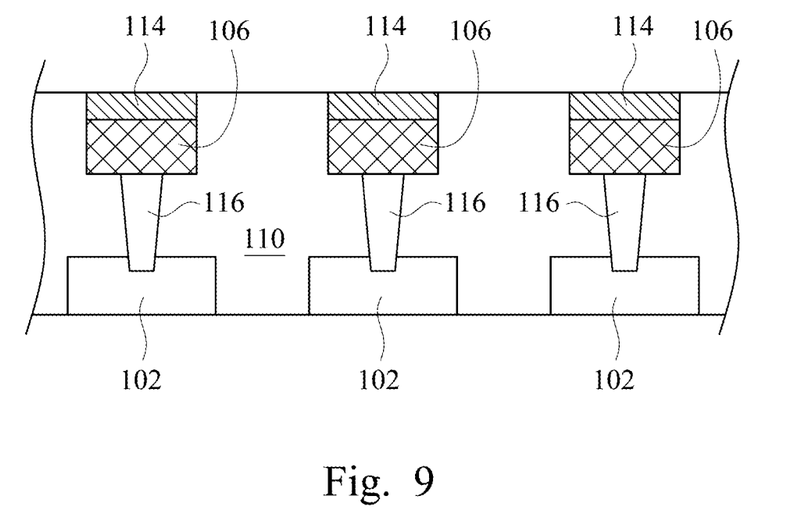
FIG. 9 is a schematic view of at least a portion of an integrated circuit manufactured according to various embodiments of the present disclosure.

FIG. 9 is a schematic view of at least a portion of an integrated circuit manufactured according to various embodiments of the present disclosure. A semiconductor substrate having a plurality of first interconnect pads 102 and a first inter-level dielectric layer 110 is provided. The first inter-level dielectric layer 110 covers the plurality of first interconnect pads 102. A plurality of first vias 116 is formed through the first inter-level dielectric layer 110. Each first via 116 is connected to the first interconnect pad 102 respectively. A plurality of second interconnect pads 106 and a plurality of end-caps 114 are formed simultaneously. For example, a plurality of cavities formed in the first inter-level dielectric layer 110 by litho/etching processes, and the plurality of cavities is respectively above the plurality of first vias 116. Suitable conductive materials are filled into the plurality of cavities, and the plurality of second interconnect pads 106 and the plurality of end-caps 114 can be both formed in the cavity-filling operation. The plurality of second interconnect pads 106 is connected to the plurality of first vias respectively, and the plurality of end-caps is disposed on the plurality of second interconnect pads respectively. The materials and methods of forming the plurality of first interconnect pads 102, the first inter-level dielectric layer 110, the plurality of first vias 116, and the plurality of end-caps 114 are similar to those of aforementioned, therefore the details are omitted here. It should be noticed that the plurality of second interconnect pads 106, and the plurality of end-caps 114 are formed before the formation of a thin film resistor, and the electrical connects between the plurality of second interconnect pads 106 and the plurality of end-caps 114 have been done by forming the plurality of end-caps 114 which is directly connected to the plurality of second interconnect pads 106 respectively. In various embodiments of the present disclosure, each second interconnect pad includes a first titanium nitride (TiN) layer, an aluminum copper (AlCu) layer, and a second titanium nitride (TiN) layer. The aluminum copper (AlCu) layer is disposed on the first titanium nitride (TiN) layer, and the second titanium nitride (TiN) layer is disposed on the aluminum copper (AlCu) layer.

Figure 10:
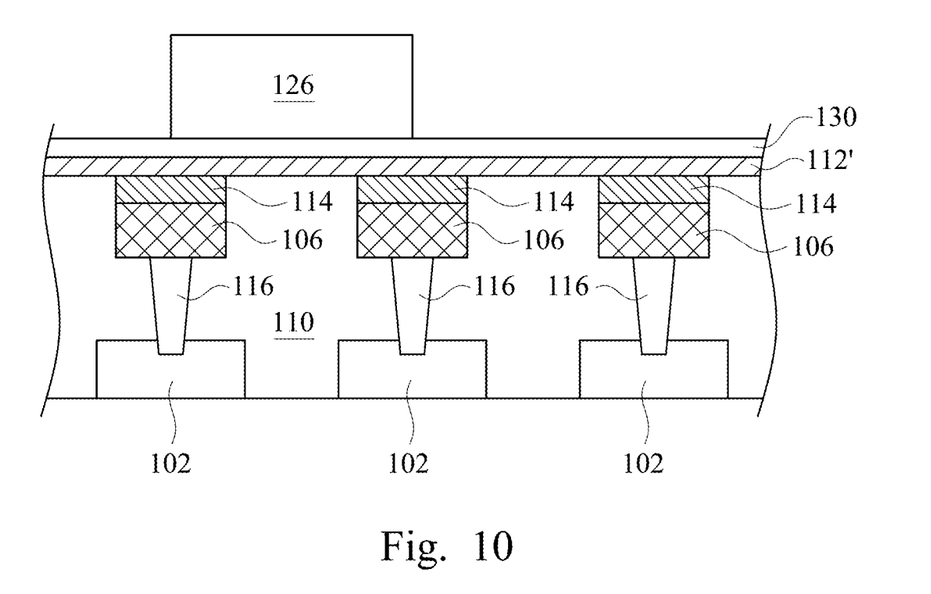
FIG. 10 is a schematic view of the integrated circuit shown in FIG. 9 in a subsequent stage of manufacture according to various embodiments of the present disclosure.

FIG. 10 is a schematic view of the integrated circuit shown in FIG. 9 in a subsequent stage of manufacture according to various embodiments of the present disclosure. A lamination of a metal resistor layer 112' and a dielectric layer 130 is formed to cover the plurality of end-caps 114 and the first inter-level dielectric layer 110. The metal resistor layer 112' is sandwiched by the plurality of end-caps 114 and the dielectric layer 130. The material and method of forming the metal resistor layer 112' are similar to aforementioned, and therefore the details are omitted here. The material and method of forming the dielectric layer 130 are also similar to those of the first inter-level dielectric layer 110, and therefore the details are omitted here. For example, the dielectric layer 130 may be silicon oxide to prevent the metal resistor layer 112' from oxidation.

Figure 11:
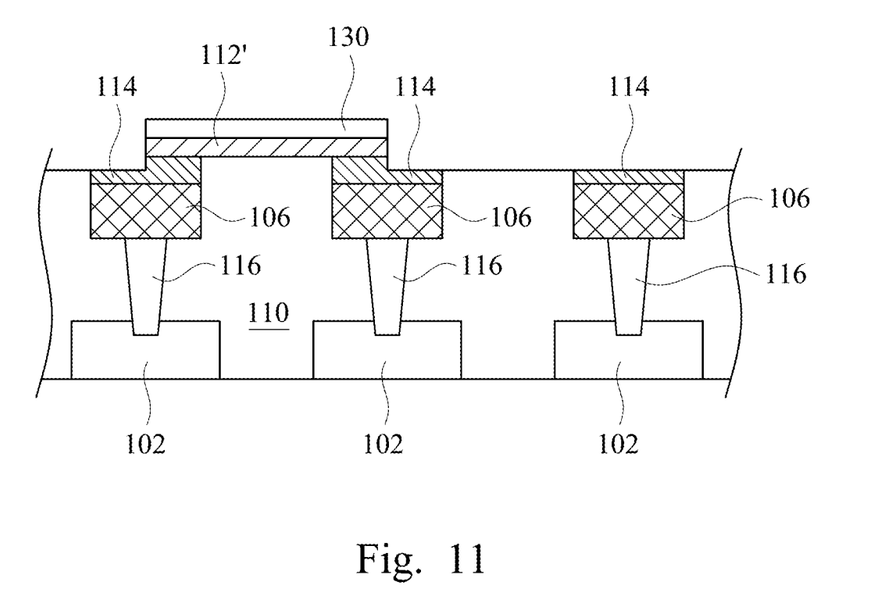
FIG. 11 is a schematic view of the integrated circuit shown in FIG. 10 in a subsequent stage of manufacture according to various embodiments of the present disclosure.

FIG. 11 is a schematic view of the integrated circuit shown in FIG. 10 in a subsequent stage of manufacture according to various embodiments of the present disclosure. The lamination of the metal resistor layer 112' and the dielectric layer 130 is pattern to define an active area of a thin film resistor 112, such that at least two electrically insulated end-caps 114 are formed. The end-caps 114 are electrically coupled only through the metal resistor layer 112'. For example, the lamination of the metal resistor layer 112' and the metal capping layer 114' is delineated with a photoresist 126 as shown in FIG. 10. The photoresist 126 masks the portions of the lamination where the metal resistor layer 112' are desired. The exposed portions of the lamination will not constitute the thin film resistor 112, and are removed with a suitable etchant. The photoresist 126 mask is then stripped after the etching process, and the structure illustrated in FIG. 6 is formed. It should be noticed that the plurality of end-caps 114 and the plurality of second interconnect pads 106 are formed simultaneously. Therefore, an extra mask for forming the two end-caps 114 is eliminated. Besides, the electrical connection between the two end-caps 114 and the second interconnect pads 106 can be easily established since the two end-caps 114 on the thin film resistor 112 is directly connected to the second interconnect pads 106 respectively. Accordingly, the cost for manufacturing of an integrated circuit is reduced because the extra mask for forming the two end-caps 114 on the thin film resistor 112 is eliminated. The process margin for manufacturing of an integrated circuit can be increased and the reliability of the integrated circuit produced can be improved due to the simplified process operations aforementioned. Referring to FIG. 11 and FIG. 3, in some embodiments of the present disclosure, after the operation of patterning the lamination of the metal resistor layer 112' and the dielectric layer 130, the second inter-level dielectric layer 122 is deposited to cover the first inter-level dielectric layer 110, and the lamination of the metal resistor layer 112' and the dielectric layer 130. The material and method of depositing the second inter-level dielectric layer 122 is similar to those of the first inter-level dielectric layer 110 aforementioned, therefore the details are omitted here. The plurality of second vias 124 is formed through the second inter-level dielectric layer 122 to connect the plurality of second interconnect pads 106 respectively. The plurality of third interconnect pads 118 is formed on the second inter-level dielectric layer 122. The plurality of third interconnect pads 118 is electrically connected to the plurality of second interconnect pads 106 respectively. Therefore, the conductive path as aforementioned in FIG. 3 is established. In other embodiments of the present disclosure as illustrated in FIG. 4, each end-cap 114 is electrically connected to one of the plurality of first interconnect pads 102 through one of the plurality of first vias 116 respectively, and therefore the conductive path as aforementioned in FIG. 4 is established.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first dielectric layer over a substrate;
   a first interconnect pad and a second interconnect pad in the first dielectric layer;
   a first via extending from the first interconnect pad to a first conductive feature;
   a second via extending from the second interconnect pad to a second conductive feature;
   a first end-cap over the first interconnect pad;
   a second end-cap over the second interconnect pad;
   a resistor layer extending from over the first end-cap to over second end-cap, wherein the resistor layer only partially overlaps the first end-cap and the second end-cap; and
   a second dielectric layer over the first dielectric layer.

2. The semiconductor device of claim 1, wherein an upper surface of the first end-cap has an indent, wherein the second dielectric layer extends along a sidewall of the indent.

3. The semiconductor device of claim 1, wherein the first dielectric layer extends over an upper surface of the first conductive feature.

4. The semiconductor device of claim 1, wherein the first dielectric layer extends along a sidewall of the first conductive feature.

5. The semiconductor device of claim 1, wherein the resistor layer directly contacts the first end-cap, the second end-cap, and an upper surface of the first dielectric layer.

6. The semiconductor device of claim 5, wherein a lower surface of the resistor layer is planar.

7. The semiconductor device of claim 1, wherein the resistor layer has a thickness in a range from about 10 Å to about 1,000 Å.

8. A semiconductor device, comprising:
   a first dielectric layer over a substrate;
   a first interconnect pad and a second interconnect pad in the first dielectric layer;
   a first end-cap over the first interconnect pad, wherein a width of a bottom of the first end-cap is equal to a width of a top surface of the first interconnect pad;
   a second end-cap over the second interconnect pad, wherein a thickness of the second end-cap closest to the first end-cap is greater than a thickness of the second end-cap furthest from the first end-cap;
   a resistor layer extending from over the first end-cap to over the second end-cap, wherein the resistor layer only partially overlaps the first end-cap and the second end-cap; and
   a second dielectric layer over the first dielectric layer.

9. The semiconductor device of claim 8, further comprising:
   a first via extending through the first dielectric layer from the first interconnect pad to a first conductive feature positioned below the first interconnect pad; and
   a second via extending through the first dielectric layer from the second interconnect pad to a second conductive feature positioned below the second interconnect pad.

10. The semiconductor device of claim 8, wherein a thickness of the first end-cap closest to the second end-cap is greater than a thickness of the first end-cap furthest from the second end-cap.

11. The semiconductor device of claim 8, wherein a first portion of the first dielectric layer extends along a first sidewall of the first end-cap, wherein a second portion of the first dielectric layer extends along a second sidewall of the first end-cap, wherein an upper surface of the first portion is higher than an upper surface of the second portion.

12. The semiconductor device of claim 8, wherein the first interconnect pad and the second interconnect pad comprises:
   a first titanium nitride layer;
   an aluminum copper (AlCu) layer on the first titanium nitride layer; and
   a second titanium nitride (TiN) layer on the aluminum copper (AlCu) layer.

13. The semiconductor device of claim 12, wherein the resistor layer comprises a silicon chromium (SiCr) layer, a tantalum nitride (TaN) layer, or a nickel chromium (NiCr) layer.

14. The semiconductor device of claim 8, wherein an upper surface of the first end-cap is level with an upper surface of the first dielectric layer.

15. A semiconductor device, comprising:
   a first dielectric layer over a substrate;
   a first interconnect pad and a second interconnect pad in the first dielectric layer;
   a first end-cap in the first dielectric layer;
   a second end-cap in the first dielectric layer, wherein a first portion of the first dielectric layer is interposed between the first end-cap and the second end-cap;
   a resistor layer extending only partially over the first end-cap, extending over an upper surface of the first portion of the first dielectric layer, and extending only partially over the second end-cap, wherein the resistor layer directly contacts a first portion of an upper surface of the first end-cap, wherein the resistor layer directly contacts a first portion of an upper surface of the second end-cap, wherein a thickness of the second end-cap adjacent the first portion of the first dielectric layer is greater than a thickness of the second end-cap along a sidewall facing away from the first portion of the first dielectric layer; and
   a second dielectric layer over the first dielectric layer.

16. The semiconductor device of claim 15, further comprising:
   a first via extending from a bottom of the first interconnect pad to a first underlying conductive feature; and
   a second via extending from a bottom of the second interconnect pad to a second underlying conductive feature.

17. The semiconductor device of claim 15, further comprising a third interconnect pad in the first dielectric layer, wherein an upper surface of the third interconnect pad is level with an upper surface of a second portion of the upper surface of the first end-cap, wherein the second portion of the upper surface of the first end-cap is lower than the first portion of the upper surface of the first end-cap.

18. The semiconductor device of claim 15, wherein the first dielectric layer comprises $SiO_2$, a low-k dielectric material having k less than 3.5, and an ELK dielectric material having a dielectric constant k less than 30.0.

19. The semiconductor device of claim 15, wherein the first dielectric layer comprises $SiO_2$, undoped silica glass (USG), phosphor doped silicate glass (PSG), fluorine doped silicate glass (FSG), a boron doped silicate glass (BSG) layer, or a boron phosphorous-doped silicate glass (BPSG).

20. The semiconductor device of claim 15, wherein an upper surface of the first portion of the first dielectric layer is level with an upper surface of the first end-cap.

* * * * *

UNITED STATES PATENT AND TRADEMARK OFFICE
CERTIFICATE OF CORRECTION

PATENT NO. : 11,742,262 B2
APPLICATION NO. : 17/233676
DATED : August 29, 2023
INVENTOR(S) : Tseng et al.

It is certified that error appears in the above-identified patent and that said Letters Patent is hereby corrected as shown below:

In the Claims

In Column 13, in Claim 18, Line 11, delete "30.0." and insert -- 3.0. --.

Signed and Sealed this
Twenty-first Day of November, 2023

Katherine Kelly Vidal
*Director of the United States Patent and Trademark Office*